United States Patent [19]

Ooe et al.

[11] Patent Number: 5,291,179
[45] Date of Patent: Mar. 1, 1994

[54] PRINTED CIRCUIT BOARD

[75] Inventors: Isao Ooe, Osaka; Hisashi Ogura, Nara, both of Japan

[73] Assignee: West Electric Company, Ltd., Osaka, Japan

[21] Appl. No.: 885,938

[22] Filed: May 20, 1992

[30] Foreign Application Priority Data

May 23, 1991 [JP] Japan .................. 3-118309

[51] Int. Cl.⁵ ........................................... H01C 1/012
[52] U.S. Cl. .................................. 338/307; 338/309; 29/620; 29/621
[58] Field of Search ................. 338/307, 308, 309; 361/398; 29/610.1, 619, 620, 621

[56] References Cited

U.S. PATENT DOCUMENTS 4,626,961 12/1986 Ono et al. .................... 361/398

Primary Examiner—Marvin M. Lateef
Attorney, Agent, or Firm—Lowe, Price, LeBlanc & Becker

[57] ABSTRACT

A printed circuit board includes a wiring pattern formed on an insulating board according to a predetermined electric circuit, and a cover member covering a portion of the wiring pattern used as a contact, the cover member being formed of an electrically conductive and non-solderable material. Due to the presence of the covering member, the wiring pattern portion is not covered with solder when the printed circuit board is subjected to dip soldering to attach various electric components to the printed circuit board. Since the covering member is electrically conductive, the wiring pattern portion can readily be used as a contact when the dip soldering is completed.

6 Claims, 3 Drawing Sheets

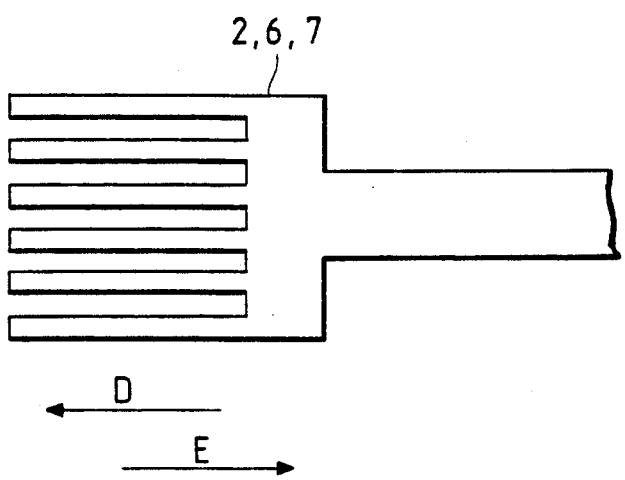

PRINTED CIRCUIT BOARD

BACKGROUND OF THE INVENTION

1. Field of the Invention

The present invention relates to a printed circuit board having a predetermined wiring pattern corresponding to a desired electric circuit formed by printing, photo-etching, etc. on a board of insulating material, such as a phenolic resin, for supporting thereon various electric components attached by soldering to the printed circuit board via terminal holes provided at predetermined portions of the wiring pattern.

2. Description of the Prior Art

Printed circuit boards are an essential part to make up an electric product. To the printed circuit board, various electric components are attached by soldering. In most cases, the soldering is achieved by using the dip soldering in which all the electric components are soldered at one time to the printed circuit board, with terminals or leads of each electric component stably received in terminal holes in the printed circuit board.

In recent years, downsizing and structural simplification have been a strong desire against products in various fields of art including a device having a printed circuit board.

In the case of the printed circuit board, the downsizing and structural simplification have been achieved by forming a switch assembly using a portion of the wiring pattern forming an electric circuit.

FIGS. 3A through 3C are cross-sectional views showing various forms of conventional switch assemblies each formed by using a portion of a printed circuit board.

The switch assembly shown in FIG. 3A is composed of a copper foil surface 2 constituting a portion of the wiring pattern formed on a printed circuit board 1, a movable contact 3 fixed to the printed circuit board 1 so that an end 3a of the movable contact 3 is selectively engageable with the copper foil surface 2, a slidable actuator 4 movable in the direction of the arrow A for bringing together the end 3a of the movable contact 3 and the copper foil surface 2, and a frame 5 slidably holding thereon the actuator 4.

The switch assembly illustrated in FIG. 3B comprises two copper foil surfaces 6 and 7 constituting a portion of the wiring pattern formed on a printed circuit board 1, a movable contact 8 having two end portions 8a and 8b selectively engageable with the copper foil surfaces 6 and 7, respectively, a pushbutton actuator 9 firmly supporting thereon the movable contact 8 and movable in the direction of arrow B for bringing the end portions 8a, 8b of the movable contact 8 into contact with the copper foil surfaces 6, 7, and a frame 5 movably holding thereon the pushbutton actuator 9.

Similarly, the switch assembly shown in FIG. 3C includes two copper foil surfaces 6 and 7 constituting a portion of the wiring pattern formed on a printed circuit board 1, a movable contact 8 having two end portions 8a and 8b selectively engageable with the copper foil surfaces 6 and 7, respectively, a slidable actuator 10 firmly supporting thereon the movable contact 8 and movable in the direction of arrow C for bringing the end portions 8a, 8b of the movable contact 8 into contact with the copper foil surfaces 6, 7, and a frame 5 slidably holding therein the slidable actuator 10.

Though not shown, each of the conventional switch assemblies also includes a mechanism for holding the actuator 4, 9 or 10 in an operating position in which the movable contact 3 or 8 is in contact with a mating fixed contact consisting of the copper foil surface 2 or surfaces 6 and 7.

In making the switch assembly shown in FIG. 3A, the movable contact 3 must be attached to the printed circuit board 1 after electric components (not shown) are attached by dip soldering to the printed circuit board 1. Accordingly, the production efficiency of this switch assembly is relatively low. In the switch assemblies shown in FIGS. 3B and 3C, the movable contact 8 is attached to the actuator 9 or 10. This construction obviates the need for an additional processing operation subsequent to the dip soldering, such as done in the case of the switch assembly shown in FIG. 3A. The switch assemblies shown in FIGS. 3B and 3C can, therefore, be produced efficiently. Due to this high production efficiency, these switch assemblies are used frequently.

However, the copper foil surface 2, 6 or 7, serving as a fixed contact relative to the movable contact 3 or 8 of the conventional switch assembly, is coated with a solder when the dip soldering is performed to attach the electric components to the printed circuit board 1.

It is known that the amount of solder deposited by dip soldering on predetermined portions of a wiring pattern is not uniform but rather changes largely though it may vary depending on the size of the portions to be soldered. Experiments made by the present applicants have proved that for portions of a printed circuit board to be used as contacts of switch assemblies, the thickness of solder deposited on such portions varies in the range of about 1 mm.

In order to take up this variation of solder thickness, it is necessary to enlarge the stroke of the movable actuator 4, 9 or 10, which enlargement of the stroke, however, will increase the overall size of a device in which the printed circuit board is incorporated.

In addition, even when the stroke of the actuator 4, 9 or 10 is enlarged as described above, a drawback still remains in that if the variation of solder thickness is excessively large, the movable contact 3 or 8, as it is moved by the actuator 4, 9 or 10, may be deformed or otherwise damaged due to abutment with the soldered portions.

In order to reduce the variation of solder thickness, there has recently been proposed an improved process in which the copper foil surface 2, 6 or 7 serving as a fixed contact on the printed circuit board 1 is in the form of a fork in plan view, as shown in FIG. 4, and the dip soldering is performed as advancing in the longitudinal direction of strips of the bifurcated copper foil surface 2, 6 or 7, as indicated by the arrows D and E shown in FIG. 4.

According to the improved process, the variation of solder thickness can be reduced to 0.1 to 0.5 mm. The improved process using the bifurcated copper foil surface 2, 6 or 7 is, however, still unsatisfactory in that because the variation of solder thickness is not reduced to zero, the foregoing problems resulting from the variation of solder thickness still remain unsolved.

As a basic solution for the variation-induced problems, a copper foil surface serving as a contact is covered with a masking material such as a paper tape or a silicone film before the dip soldering is performed. Subsequent to the dip soldering, the masking material is removed.

This solution is effective because the copper foil surface serving as a contact is not subjected to the dip soldering and hence is not coated with solder. Accordingly, the problems caused by the variation in thickness of solder on the copper foil surface do not take place any more.

However, due to the use of the masking material, the foregoing solution needs additional processing operations including application and removal of the masking material and inspection of the presence of the masking material. With this additional processing operations, the production cost of a printed circuit board is increased.

SUMMARY OF THE INVENTION

With the foregoing drawbacks of the prior art in view, it is an object of the present invention to provide a printed circuit board which has a copper foil surface capable of operating as an electric contact without damaging a mating switch contact and which can be manufactured at a low cost without the need for an additional processing operation subsequent to the dip soldering.

A printed circuit board of this invention comprises an insulating board, a wiring pattern formed on said insulating board according to a predetermined electric circuit, and an electrically conductive and non-solderable covering member covering a portion of said wiring pattern. Preferably, the covering member is a carbon resistor.

With this construction, the portion of the wiring pattern covered with the non-solderable covering member is not coated with solder when the printed circuit board is subjected to dip soldering for mounting thereon various electric components. Since the covering member is electrically conductive, the wiring pattern portion covered with the covering member can readily be used as a contact without the necessity of an additional processing operation.

The above and other objects, features and advantages of the present invention will become more apparent from the following description when making reference to the detailed description and the accompanying sheets of drawings in which a preferred structural embodiment incorporating the principles of the present invention is shown by way of illustrative example.

BRIEF DESCRIPTION OF THE DRAWINGS

FIG. 4 is a plan view of a copper foil surface formed on a conventional printed circuit board to form a switch contact.

DETAILED DESCRIPTION OF THE INVENTION

Figure 1:
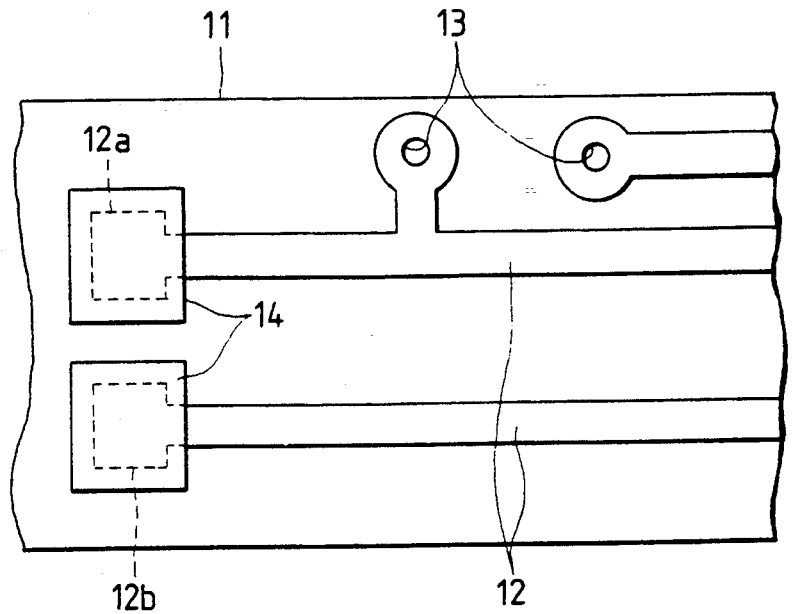
FIG. 1 is a fragmentary plan view of a printed circuit board according to the present invention.

As shown in FIG. 1, a printed circuit board according to the present invention includes an insulating board 11 made from a phenolic resin, for example, a wiring pattern 12 of copper foil, for example, formed on the insulating board 11 according to a predetermined electric circuit, a plurality of terminal holes 13 (two being shown) for receiving therein terminals or leads of various electric components (not shown) to be mounted by soldering on the printed circuit board, and a plurality of covering members 14 (two being shown) covering portions 12a and 12b, respectively, of the wiring pattern 12 used as fixed contacts of a switch assembly described later.

The covering members 14 are made of a carbon resistor and formed by printing on the wiring pattern portions 12a and 12b. The carbon resistor is a material which is electrically conductive and non-solderable. The term "non-solderable" is used herein to refer to the ability to prevent union with solder.

The non-illustrated electric components are preassembled with the printed circuit board, with leads or terminals of the individual electric components stably received in the corresponding terminal holes 13. Then, the printed circuit board is subjected to dip soldering. In this instance, since the wiring pattern portions 12a, 12b used as switch contacts are covered with the non-solderable covering members 14, they are completely protected from adhesion or union with solder regardless of the direction of advance of the dip soldering operation.

In addition, since the covering members 14 are made of an electrically conductive carbon resistor, the wiring pattern portions 12a and 12b covered with the covering members 14 can readily be used as switch contacts upon completion of the dip soldering. As opposed to the conventional masking member comprising a paper tape or a silicone film, the covering members 14 is allowed to stand without removal and inspection after the dip soldering process is completed.

Figure 2:
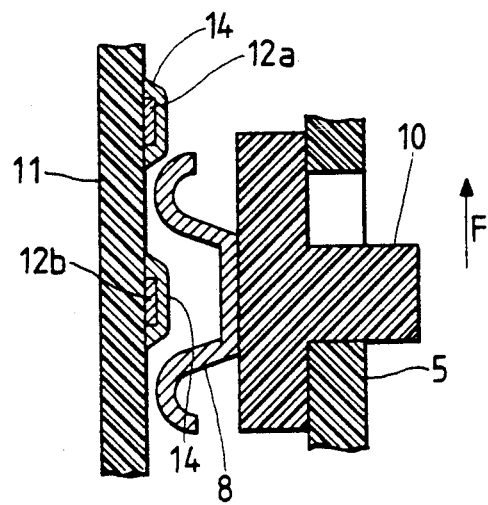
FIG. 2 is an enlarged cross-sectional view of a main portion of a switch assembly using a portion of the printed circuit board.
Figure 3A:
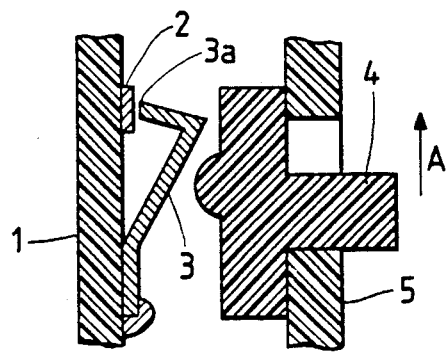
FIGS. 3A, 3B and 3C are cross-sectional views showing various forms of switch assemblies each including a portion of a conventional printed circuit board.
Figure 3B:
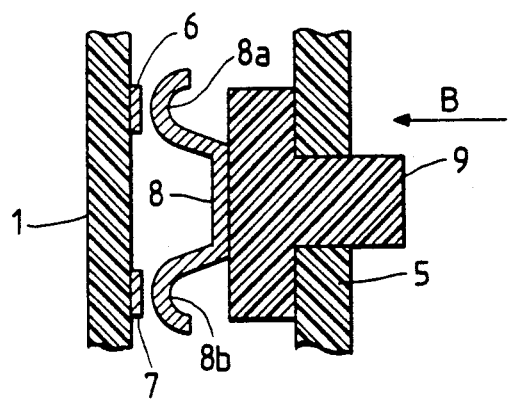
Figure 3C:
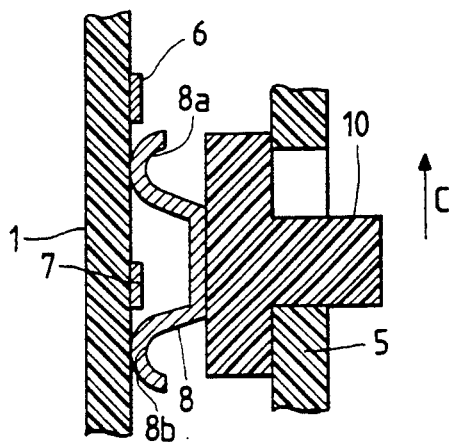

FIG. 2 shows a switch assembly in which portions 12a, 12b of the wiring pattern 12 covered with covering members 14 of carbon resistors are incorporated so as to form fixed contacts of the switch assembly. The switch assembly includes a frame 5, a movable contact 8, and an actuator 10 slidably mounted on the frame 5 and firmly supporting the movable contact 8. With the switch assembly thus constructed, when the slidable actuator 10 is moved in the direction of the arrow F, the movable contact 8 is electrically connected with the wiring pattern portions 12a, 12b via the conductive covering members 14.

As described above, a printed circuit board of this invention includes a portion of the wiring pattern serving as a switch contact and covered with a covering member which is non-solderable and electrically conductive. When the printed circuit board is subjected to dip soldering for mounting various electric components thereon, the wiring pattern portion covered with the non-solderable covering member is not coated with solder. Since the covering member is electrically conductive, the wiring pattern portion can readily be used as an electric contact without the need for any additional process subsequent to the dip soldering. The printed circuit board can, therefore, be manufactured at a low cost. In addition, the copper foil surface serving as an electric contact is free from solder so that it does not damage a mating switch contact during operation of a switch assembly. Furthermore, the electric contact covered with the covering member is highly resistant to corrosion and, hence, the printed circuit board is durable as a whole.

Obviously, various minor changes and modifications of the present invention are possible in the light of the above teaching. It is therefore to be understood that within the scope of the appended claims the invention may be practiced otherwise than as specifically described.

What is claimed is:

1. A printed circuit board comprising:
an insulating board;
a wiring pattern formed on said insulating board according to a predetermined electric circuit, said wiring pattern including a plurality of terminal holes for receiving therein terminals of various electric components to be attached by dip soldering to said printed circuit board, said wiring pattern further including a contact of a switch assembly at a portion thereof; and
an electrically conductive and non-solderable covering member covering said portion of said wiring pattern, said covering member ensuring that said portion covered thereby can readily be used as said contact of said switch assembly upon completion of the dip soldering which is effected to mount the various electric components on said printed circuit board.

2. A printed circuit board according to claim 1, wherein said covering member is a carbon resistor.

3. A printed circuit board comprising:
an insulating board made from a phenolic resin or the like;
a wiring pattern formed by a copper foil surface on said insulating board according to a predetermined electric circuit;
a plurality of terminal holes formed at predetermined portions of said wiring pattern for receiving therein terminals of various electric components to be attached by dip soldering to said printed circuit board; and
a covering member made of a non-solderable and electrically conductive material and covering a portion of said copper foil surface of said wiring pattern which is used as a contact of a switch assembly for preventing deposition of solder on said portion covered thereby, thereby ensuring that said portion covered thereby can readily be used as said contact of said switch assembly upon completion of the dip soldering which is effected to mount the various electric components on said printed circuit board.

4. A printed circuit board according to claim 3, wherein said covering member comprises a carbon resistor printed on said portion of said copper foil surface of said wiring pattern.

5. A printed circuit board comprising:
a rigid insulating board for supporting circuit components mounted thereto by dip soldering;
a wiring pattern formed on said insulating board according to a predetermined electric circuit;
said wiring pattern including:
a plurality of terminal holes for receiving therein terminals of said dip soldered circuit components, and
a contact portion comprising a fixed contact of a switch assembly; and
an electrically conductive and non-solderable covering member for preventing deposition of solder on said contact portion during a dip solder process,
said covering member covering said contact portion of said wiring pattern,
whereby said covering portion is readily usable as said contact of said switch assembly upon completion of a dip soldering procedure effected to mounting the circuit components on said printed circuit board.

6. A method making a printed circuit board comprising the steps of:
providing a rigid insulating board;
forming a wiring pattern on said insulating board according to a predetermined electric circuit,
including in said wiring pattern a plurality of terminal holes for receiving therein terminals of various electric components to be attached by dip soldering to said printed circuit board,
further including in said wiring pattern a contact portion having a contact of a switch assembly; and
preventing deposition of solder on said contact portion during a dip solder process by providing an electrically conductive and non-solderable covering member for covering said contact portion of said wiring pattern,
thereby ensuring that said contact portion covered by said covering member can readily be used as said contact of said switch assembly upon completion of the dip soldering effected to mount the various electric components on said printed circuit board.

* * * * *